United States Patent
Hu et al.

(10) Patent No.: US 9,490,129 B2
(45) Date of Patent: Nov. 8, 2016

(54) INTEGRATED CIRCUITS HAVING IMPROVED GATE STRUCTURES AND METHODS FOR FABRICATING SAME

(71) Applicant: GLOBALFOUNDRIES, Inc., Grand Cayman (KY)

(72) Inventors: Xiang Hu, Clifton Park, NY (US); Huang Liu, Mechanicville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 92 days.

(21) Appl. No.: 14/272,952

(22) Filed: May 8, 2014

(65) Prior Publication Data

US 2015/0325482 A1 Nov. 12, 2015

(51) Int. Cl.

| H01L 21/336 | (2006.01) |
|---|---|
| H01L 21/28 | (2006.01) |
| H01L 21/8234 | (2006.01) |
| H01L 29/49 | (2006.01) |
| H01L 29/66 | (2006.01) |
| H01L 21/308 | (2006.01) |
| H01L 21/3105 | (2006.01) |
| H01L 21/3213 | (2006.01) |
| H01L 21/311 | (2006.01) |
| H01L 27/088 | (2006.01) |

(52) U.S. Cl.
CPC ... *H01L 21/28123* (2013.01); *H01L 21/28035* (2013.01); *H01L 21/308* (2013.01); *H01L 21/311* (2013.01); *H01L 21/3105* (2013.01); *H01L 21/31053* (2013.01); *H01L 21/31111* (2013.01); *H01L 21/3213* (2013.01); *H01L 21/32133* (2013.01); *H01L 21/823437* (2013.01); *H01L 29/49* (2013.01); *H01L 29/4916* (2013.01); *H01L 29/66* (2013.01); *H01L 29/6681* (2013.01); *H01L 29/66553* (2013.01); *H01L 21/823431* (2013.01); *H01L 27/0886* (2013.01)

(58) Field of Classification Search
CPC .................. H01L 21/823437; H01L 21/28123
USPC ......................................... 438/261
See application file for complete search history.

(56) References Cited

U.S. PATENT DOCUMENTS

| 2006/0071275 A1* | 4/2006 | Brask | H01L 21/845 257/350 |
|---|---|---|---|
| 2006/0094241 A1* | 5/2006 | Park | C23F 1/20 438/689 |
| 2012/0052647 A1* | 3/2012 | Kim | H01L 21/28114 438/300 |
| 2013/0062708 A1* | 3/2013 | Zhong | H01L 29/66545 257/401 |

* cited by examiner

*Primary Examiner* — Ajay K Arora
(74) *Attorney, Agent, or Firm* — Lorenz & Kopf, LLP (57) ABSTRACT

Integrated circuits with improved gate structures and methods for fabricating integrated circuits with improved gate structures are provided. In an embodiment, a method for fabricating an integrated circuit includes providing a semiconductor substrate with fin structures. A gate-forming material is deposited over the semiconductor substrate and fin structures. The method includes performing a first etch process to etch the gate-forming material to form a gate line having a first side and a second side. The first side and second side of the gate line are bounded with material. The method includes performing a second etch process to etch a portion of the gate line bound by the material to separate the gate line into adjacent gate structures and to define a tip-to-tip distance between the adjacent gate structures.

20 Claims, 9 Drawing Sheets

INTEGRATED CIRCUITS HAVING IMPROVED GATE STRUCTURES AND METHODS FOR FABRICATING SAME

TECHNICAL FIELD

The present disclosure generally relates to integrated circuits and methods for fabricating integrated circuits, and more particularly relates to integrated circuits having gate structures that may be distanced from adjacent gate structures by tip-to-tip distances below lithography process capabilities and methods for fabricating the same.

BACKGROUND

In contrast to traditional planar metal-oxide-semiconductor field-effect transistors (MOS transistors or MOSFETs), non-planar MOSFETs incorporate various vertical transistor structures. One such transistor structure is the "FinFET," which takes its name from the multiple thin silicon "fins" that are used to form the respective gate channels and that are typically on the order of tens of nanometers in width.

The prior art is replete with different techniques and processes for fabricating MOS transistor semiconductor devices, including both planar and non-planar devices. In accordance with typical fabrication techniques, a MOS transistor integrated circuit is formed by creating a device structure on a semiconductor substrate, where the device structure includes a gate structure, source and drain regions, and a channel region. Some integrated circuit devices are fabricated using a "replacement" gate technique; in accordance with this technique, sacrificial gate material (typically polycrystalline or amorphous silicon) is removed, temporarily forming a trench-like structure (hereinafter "trench"), and then is replaced with a different "replacement" gate material.

With the ongoing scaling of transistor dimensions, gate structure pitches and lengths, as well as tip-to-tip distances between gate structures, must decrease. The decreasing dimensions of gate structures are difficult to attain using typical lithography patterning and etching processes. Etch shrink-related defects further reduce the dimensional accuracy of gate structures formed by conventional lithography at desired technology nodes.

Accordingly, it is desirable to provide integrated circuits having improved gate structures and methods for fabricating integrated circuits having improved gate structures. Further, it is desirable to provide integrated circuits with gate structures separated by tip-to-tip distances having dimensions less than critical dimensions of current lithography techniques. Furthermore, other desirable features and characteristics will become apparent from the subsequent detailed description and the appended claims, taken in conjunction with the accompanying drawings, the brief summary, and this background.

BRIEF SUMMARY

Integrated circuits with improved gate structures and methods for fabricating integrated circuits with improved gate structures are provided. In accordance with one embodiment, a method for fabricating an integrated circuit includes providing a semiconductor substrate with fin structures. A gate-forming material is deposited over the semiconductor substrate and fin structures. The method includes performing a first etch process to etch the gate-forming material to form a gate line having a first side and a second side. The first side and second side of the gate line are bounded with material. The method includes performing a second etch process to etch a portion of the gate line bound by the material to separate the gate line into adjacent gate structures and to define a tip-to-tip distance between the adjacent gate structures.

In another embodiment, a method for fabricating an integrated circuit includes providing a semiconductor substrate and forming over the semiconductor substrate a sacrificial gate line having a first side and a second side. The method bounds each side of the sacrificial gate line with sidewall spacers. The method includes etching a region of the sacrificial gate line bounded by the sidewall spacers to separate adjacent sacrificial gate structures and to define a tip-to-tip distance between the adjacent sacrificial gate structures. The method replaces the sacrificial gate structures with replacement gate structures.

In accordance with another embodiment, an integrated circuit is provided. The integrated circuit includes a semiconductor substrate and fin structures overlying the semiconductor substrate. The integrated circuit further includes a first sidewall spacer distanced from a second sidewall spacer. Also, the integrated circuit includes a series of alternating gate structures and dielectric blocks bound between the first sidewall spacer and the second sidewall spacer. Adjacent gate structures are separated by a tip-to-tip distance of from about 10 nanometers (nm) to about 50 nm.

BRIEF DESCRIPTION OF THE DRAWINGS

Embodiments of the integrated circuits having improved gate structures and methods for fabricating integrated circuits having improved gate structures will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

As described herein, gate structures are formed from a gate-forming material via two separate etch processes. The first etch process can be performed via a lithography technique including forming a mask over the gate-forming material and etching the gate-forming material into gate lines. The gate lines are then bound by a deposited material, such as sidewall spacers. Then, a second etch process is performed to form gate structures from the gate line. Specifically, a cut mask is patterned over the gate line and the exposed portion of the gate line is etched to form a trench self-aligned with the spacers. Thereafter, the trench may be filled with a dielectric material. In this manner, the gates are separated from one another by a tip-to-tip distance provided with greater control. Further processing may include replacing the gate structures with a different gate structure material, such as in a replacement gate process.

In accordance with the various embodiments herein, integrated circuits having improved gate structures and methods for fabricating integrated circuits having improved gate structures are provided. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Figure 1:
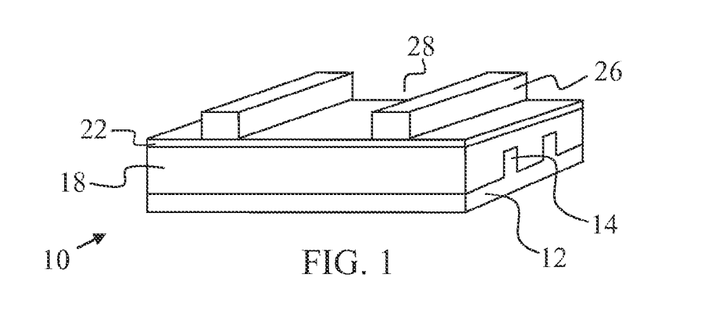
FIG. 1 is a perspective view illustrating a portion of an integrated circuit with improved gate structures in accordance an exemplary embodiment.

In FIG. 1, an integrated circuit 10 is illustrated during a lithography process. As shown, the partially fabricated integrated circuit 10 includes a semiconductor substrate 12. The semiconductor substrate 12 is a suitable semiconductor material as typically used in the semiconductor industry, e.g., relatively pure silicon or silicon admixed with other elements such as germanium, carbon, and the like. Alternatively, the semiconductor material can be germanium, gallium arsenide, or the like. The semiconductor material may be provided as a bulk semiconductor substrate, or it could be provided as a semiconductor-on-insulator (SOI) substrate, which includes a support substrate, an insulator layer on the support substrate, and a layer of semiconductor material on the insulator layer. Alternatively, the semiconductor substrate 12 may include a compound semiconductor such as silicon carbide, gallium arsenide, indium arsenide, or indium phosphide. Further, the semiconductor substrate 12 may optionally include an epitaxial layer.

Semiconductor fin structures 14 are formed from the semiconductor substrate 12 for use in a FinFET. The fin structures 14 may be formed from material from the semiconductor substrate 12 (such as the upper semiconductor layer in an SOI substrate), with material formed on the semiconductor substrate 12, or by a combination of material from the semiconductor substrate 12 and material formed on the semiconductor substrate 12. In an exemplary method, the fin structures 14 are etched from the upper semiconductor layer using a lithography patterning and etching process.

As shown, a gate-forming material 18 is formed overlying the fin structures 14 and the semiconductor substrate 12. As used herein, "overlying" means "on" and "over". In this regard, the gate-forming material 18 may lie directly on the semiconductor substrate 12 and fin structures 14 such that it makes physical contact with the semiconductor substrate 12 and fin structures 14 or it may lie over the semiconductor substrate 12 and fin structures 14 such that another material layer is interposed between the gate-forming material 18 and the semiconductor substrate 12 and fin structures 14. For example, an etch stop layer (not shown) may be provided between the gate-forming material 18 and the semiconductor substrate 12 and fin structures 14. Further, as used herein, "overlying", "over", "upper", "vertical" and "horizontal" describe the orientation and/or location of a feature or element within the consistent but arbitrary frame of reference illustrated by the drawings. In an exemplary embodiment, the gate-forming material 18 is used to form sacrificial gate structures. Thus, the gate-forming material 18 may be formed by any suitable material that enables effective processing and selective removal. In exemplary embodiments, the gate-forming material 18 is amorphous silicon, polycrystalline silicon, amorphous carbon, or another suitable material. The gate-forming material 18 may be deposited using chemical vapor deposition (CVD), plasma enhanced chemical vapor deposition (PECVD), physical vapor deposition (PVD), or another suitable process. An exemplary gate-forming material 18 has a thickness of from about 40 nanometers (nm) to about 200 nm. In an exemplary method, the gate-forming material 18 is planarized to reduce topography, such as by chemical mechanical planarization (CMP).

In the exemplary embodiment of FIG. 1, a capping layer 22 is formed over the gate-forming material 18. An exemplary capping layer 22 is silicon nitride, though other materials suitable as a hard mask may be used. In an exemplary embodiment, the capping layer 22 is deposited via CVD. An exemplary capping layer 22 has a thickness of from about 10 nm to about 100 nm. A mask 26, such as photoresist, is formed and patterned over the capping layer 22 according to conventional lithography processing. As shown, the patterned mask 26 includes open portions 28 that expose underlying regions of the capping layer 22 and gate-forming material 18 to be removed.

Figure 2:
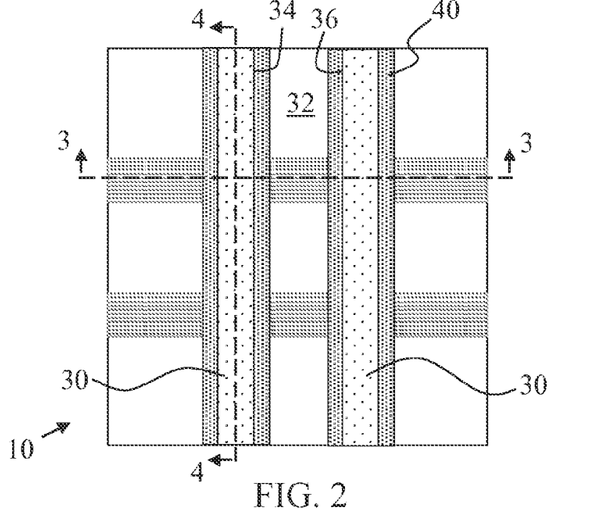
FIGS. 2, 5, 9, 13, 17, 21, 25, 29 and 33 are overhead views of a portion of an integrated circuit and illustrating method steps for fabricating the integrated circuit with improved gate structures in accordance with various embodiments herein.
Figure 3:
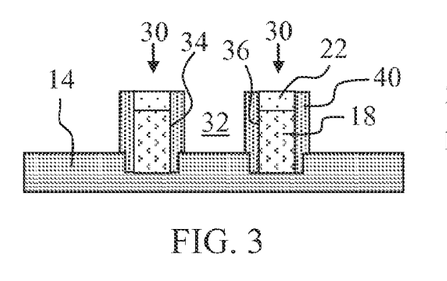
FIGS. 3-4, 6-8, 10-12, 14-16, 18-20, 22-24, 26-28, 30-32, and 34-36 are cross-sectional views of the portion of the integrated circuit taking along lines shown in respective overhead views and illustrating method steps for fabricating the integrated circuit with improved gate structures in accordance with various embodiments herein.
Figure 4:
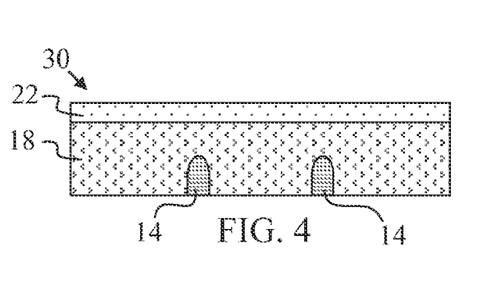

The method may continue as shown in FIGS. 2-4, which illustrate the partially fabricated integrated circuit 10 at a common stage of fabrication after further processing of the integrated circuit of FIG. 1. FIG. 2 is an overhead view of the integrated circuit 10, FIG. 3 is a cross-sectional view taken along line 3-3 in FIG. 2, and FIG. 3 is a cross-sectional view taken along line 4-4 in FIG. 2. In FIGS. 2-4, the exposed regions of the capping layer 22 and gate-forming material 18 are etched using the patterned mask 26 as an etch mask. In an exemplary embodiment, the exposed regions are etched using a reactive ion etch (RIE). As a result of the etching process, parallel gate lines 30 are formed from the gate-forming material and are separated from one another by gaps 32. Each gate line 30 has a first side 34 and a second side 36 bounding the gaps 32. Each gate line 30 is covered by a cap 38 formed from the capping layer 22.

During or after the etch process forming the gate lines 30, the patterned mask 26 is removed. Sidewall spacers 40 are formed adjacent the sides 34 and 36 of each gate line 30. For example, a sidewall spacer material is deposited over the gate lines 30, caps 38, and semiconductor substrate 12. An exemplary sidewall spacer material may be formed of silicon nitride, silicon dioxide, or any type of organic or inorganic material having etch selectivity with respect to the gate lines 30. In an exemplary process, the sidewall spacer material is conformally deposited such as by atomic layer deposition (ALD), plasma-enhanced chemical vapor deposition (PECVD), a low pressure chemical vapor deposition (LPCVD), or another chemical vapor deposition process. The sidewall spacer material is then etched by a selective RIE process. An exemplary etch uses an RIE process with chemistries based upon $CHF_3$ or $CF_4$ to etch silicon oxide or silicon oxynitride, or upon $CHF_3/O_2$ to etch silicon nitride. As a result, sidewall spacers 40 are formed as shown.

FIG. 3 illustrates that the fin structures 14 may be thickened by an epitaxial process. A standard epitaxy process may be employed, as known in the art. For example, silicon may be epitaxially grown from a silicon tetrachloride precursor. Dopants may be introduced during the epitaxy process if so desired to dope the source and drain regions. Suitable dopants include, but are not limited to, boron and phosphorous. Alternatively, ion implantations may be performed using the gate lines 30 and sidewall spacers 40 as a mask to form implant regions in the fin structures 14.

Figure 5:
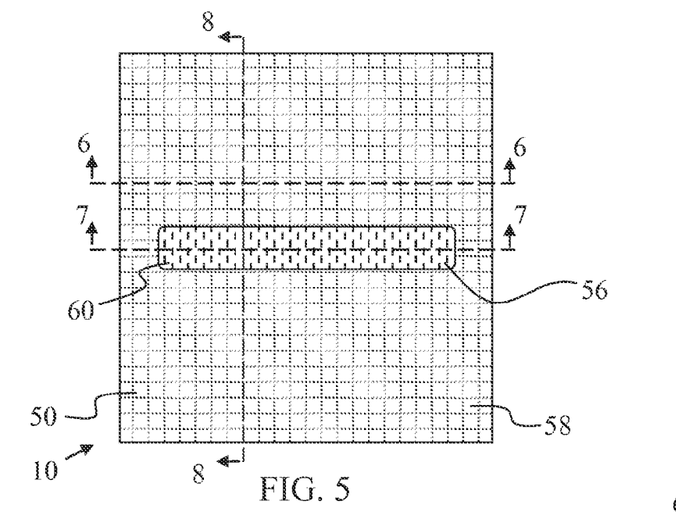
Figure 6:
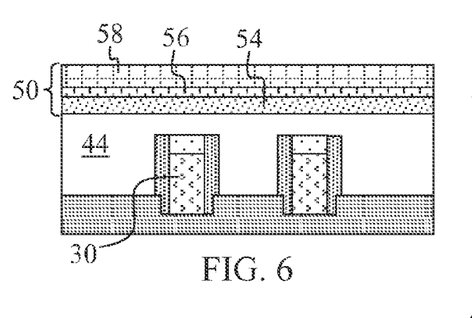
Figure 7:
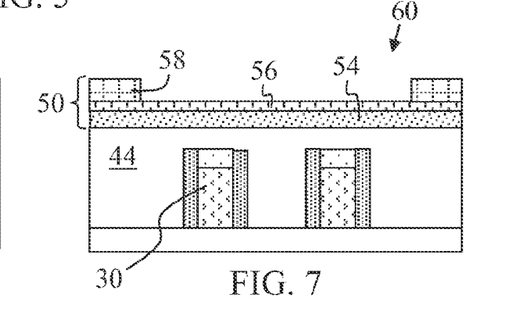
Figure 8:
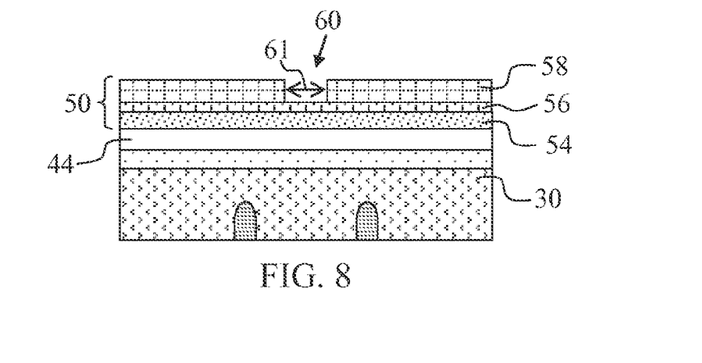

FIGS. 5-8 illustrate the integrated circuit 10 at a stage of fabrication after further processing. FIG. 5 is an overhead view of the integrated circuit 10, FIG. 6 is a cross-sectional view taken along line 6-6 in FIG. 5, FIG. 7 is a cross-sectional view taken along line 7-7 in FIG. 5, and FIG. 8 is a cross-sectional view taken along line 8-8 in FIG. 5. As shown, a dielectric layer 44 is deposited over the gate lines 30, caps 38, spacers 40, and semiconductor substrate 12. An exemplary dielectric layer 44 is silicon oxide, such as hydrogen silsesquioxane-based flowable oxide. In an exemplary embodiment, the dielectric layer 44 is blanket deposited, such as by spin-coating or CVD. The dielectric layer 44 may be planarized such as by CMP.

A cut mask 50 is formed and pattered over the dielectric layer 44. An exemplary cut mask 50 includes a plurality of lithographic-aiding layers. Specifically, exemplary cut mask 50 includes an optical planarizing layer (OPL) 54, an anti-reflective coating (ARC) layer 56 overlying the OPL 54, and a photoresist layer 58 overlying the ARC layer 56. The OPL 54 is formed at a predetermined thickness to provide reflectivity and topography control during etching. Within the three lithographic-aiding layers, the photoresist layer 58 is typically approximately the same thickness as the OPL 54 (e.g., approximately 200 nanometers (nm)), while the ARC layer 56 is typically less than half the thickness of the OPL 54 (e.g., approximately 80 nm). In an exemplary embodiment, the OPL 54 is deposited by spin coating. An exemplary OPL 54 includes an organic polymer including carbon, hydrogen, oxygen, and optionally fluorine. For example, OPL 54 can include hydrocarbons and/or hydrofluorocarbons. In an exemplary embodiment, the ARC layer 56 is deposited by spin coating. An exemplary ARC layer 56 contains silicon and can include a hydrocarbon based material having a different material composition than the OPL 54. As shown, the photoresist layer 58 is patterned with an open region 60 exposing a portion of the underlying ARC layer 56, OPL 54, dielectric layer 44, caps 38 and gate lines 30. In the plane of FIG. 7, each gate line 30 is entirely exposed between spacers 40, i.e. no portion of gate line 30 in the plane of FIG. 7 is covered by the photoresist layer 58. In the plane of FIG. 8, the exposed portion of each gate line 30 is directly related to the dimension 61 of the open region 60 in the photoresist layer 58.

Figure 9:
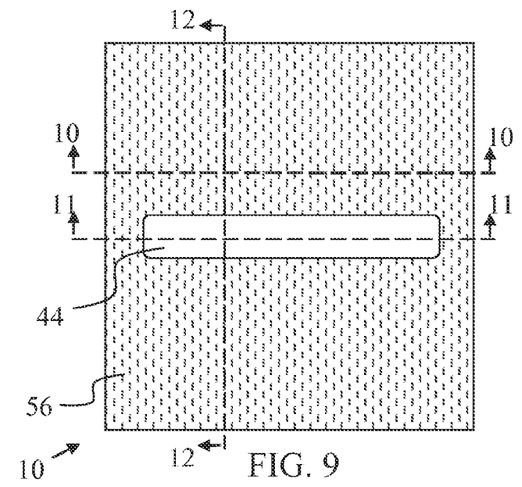
Figure 10:
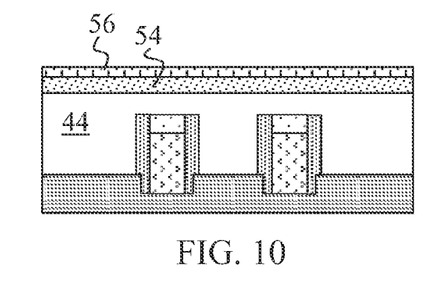
Figure 11:
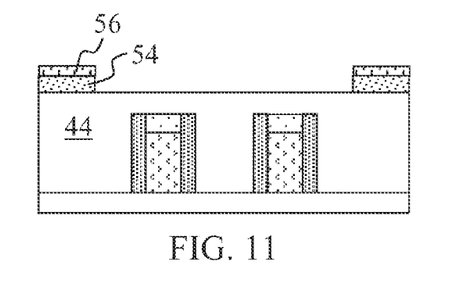
Figure 12:
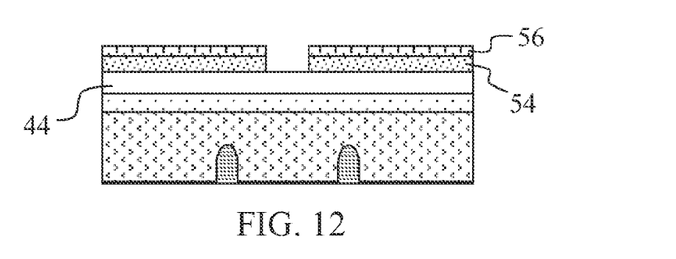

FIGS. 9-12 illustrate the integrated circuit 10 at a stage of fabrication after further processing. FIG. 9 is an overhead view of the integrated circuit 10, FIG. 10 is a cross-sectional view taken along line 10-10 in FIG. 9, FIG. 11 is a cross-sectional view taken along line 11-11 in FIG. 9, and FIG. 12 is a cross-sectional view taken along line 12-12 in FIG. 9. In FIGS. 9-12, the ARC layer 56 and OPL 54 are anisotropically etched. An exemplary etch uses an RIE process with chemistries based upon $CHF_3$ or $CF_4$ to etch silicon oxide or silicon oxynitride, or upon $CHF_3/O_2$ to etch silicon nitride. The etch process may remove the photoresist layer 58.

Figure 13:
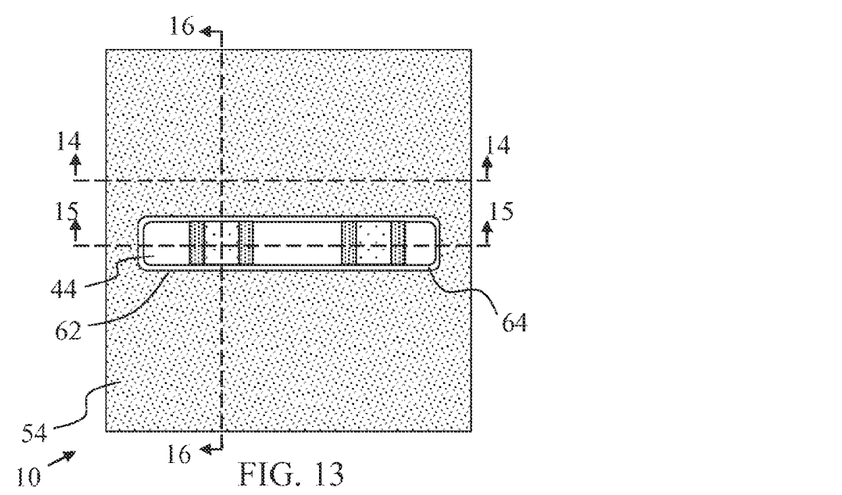
Figure 14:
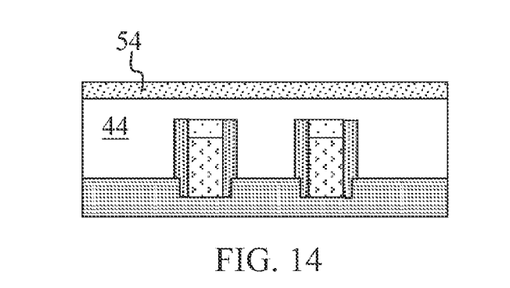
Figure 15:
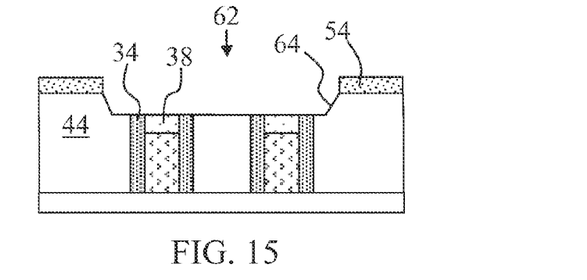
Figure 16:
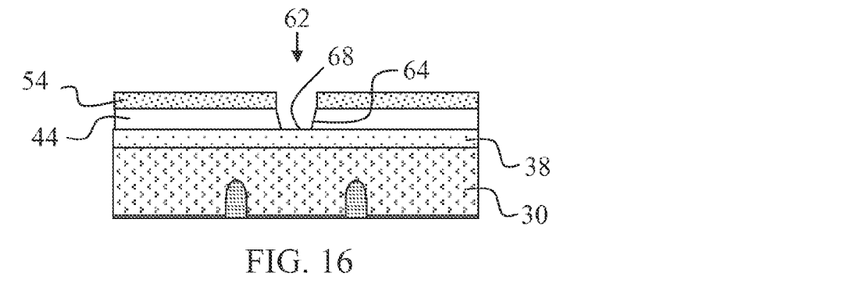

The exemplary method may continue as shown in FIGS. 13-16. FIGS. 13-16 illustrate the integrated circuit 10 at a common stage of fabrication. FIG. 13 is an overhead view of the integrated circuit 10, FIG. 14 is a cross-sectional view taken along line 14-14 in FIG. 13, FIG. 15 is a cross-sectional view taken along line 15-15 in FIG. 13, and FIG. 16 is a cross-sectional view taken along line 16-16 in FIG. 13. As shown, the dielectric layer 44 is etched to form an opening 62 in the dielectric layer 44 bounded by tapered walls 64. The opening 62 exposes the cap 38 and sidewall spacers 40. An exemplary etch uses an RIE process with chemistries based upon $CHF_3$ or $CF_4$ to etch silicon oxide or silicon oxynitride, or upon $CHF_3/O_2$ to etch silicon nitride. As shown in FIG. 16, the opening 62 exposes a selected portion 68 of the underlying caps 38 and gate lines 30 to be subsequently etched. In reference to FIG. 16, it may be seen that adjusting the slope or angle of the tapered walls 64 changes the area of the selected portion 68 exposed by the opening 62. For example, increasing the slope, i.e., closer to vertical, increases the area of the selected portion 68, while decreasing slope, i.e., closer to horizontal, decreases the area of the selected portion 68. Adjusting the slope or angle of the tapered walls 64 and changing the area of the selected portion 68 provides for adjusting the tip-to-tip distance between adjacent gate structures formed from the gate lines 30 as described below. As shown in FIGS. 13-16, the etch process may remove the ARC layer 56.

Figure 17:
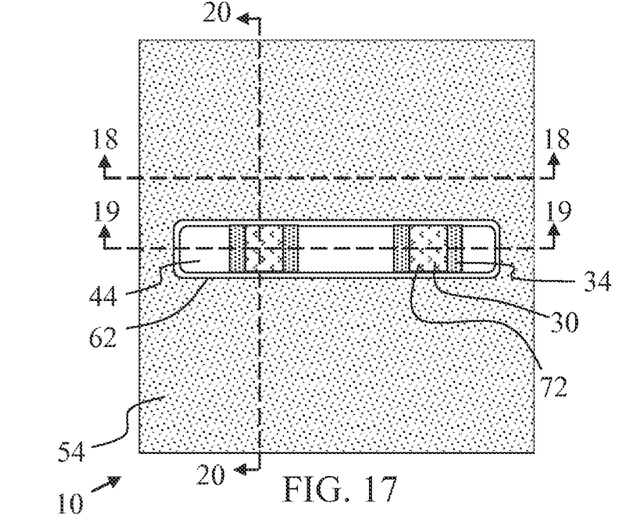
Figure 18:
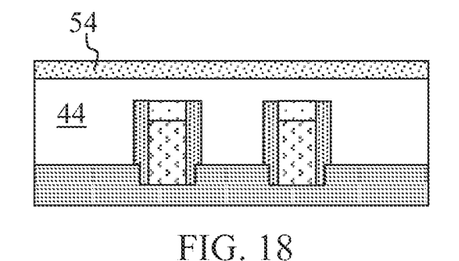
Figure 19:
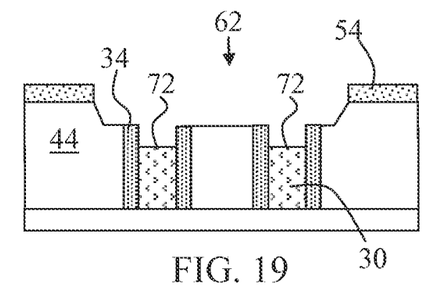
Figure 20:
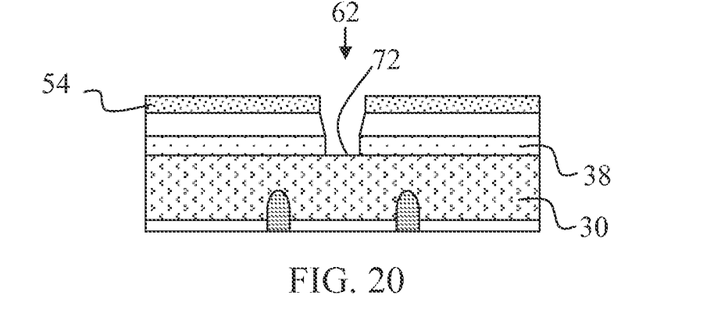

FIGS. 17-20 illustrate the integrated circuit 10 at a common stage of fabrication after further processing. FIG. 17 is an overhead view of the integrated circuit 10, FIG. 18 is a cross-sectional view taken along line 18-18 in FIG. 17, FIG. 19 is a cross-sectional view taken along line 19-19 in FIG. 17, and FIG. 20 is a cross-sectional view taken along line 20-20 in FIG. 17. In FIGS. 17-20, the selected portion 68 of the cap 38 exposed by the opening 62 is anisotropically etched. For example, an RIE etch process may be used to selectively etch the cap 38 while the sidewall spacers 40 and dielectric layer 44 remain substantially unetched. An exemplary etch uses an RIE process with chemistries based upon $CHF_3/O_2$ to etch silicon nitride. As shown, the selected portion of each cap 38 is completely removed to expose a selected portion 72 of each gate line 30. Through use of an anisotropic etch, the surface area of the selected portion 72 of each gate line 30 is substantially equal to the surface area of the selected portion 68 of each cap 38. Though not shown, the etch for removing the selected portion of the cap 38 may also remove the OPL 54.

Figure 21:
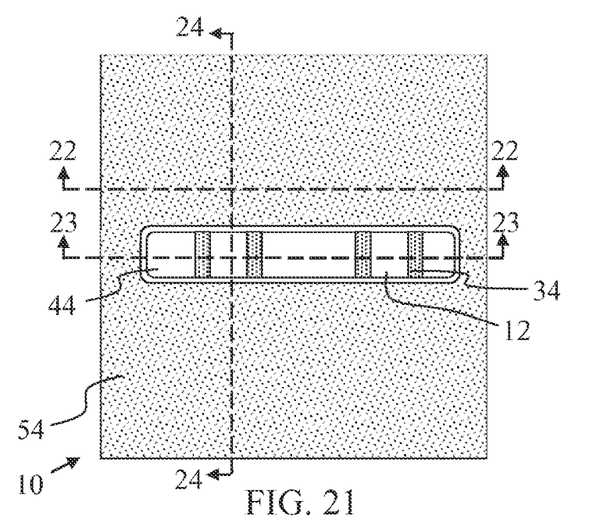
Figure 22:
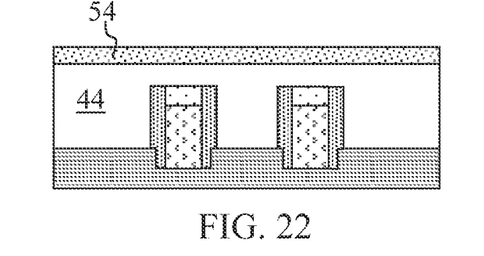
Figure 23:
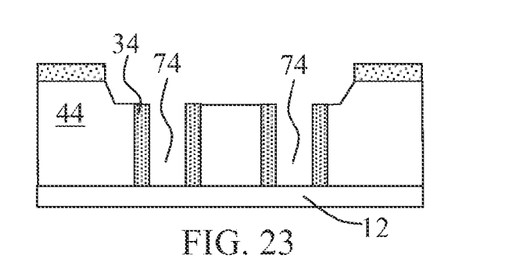
Figure 24:
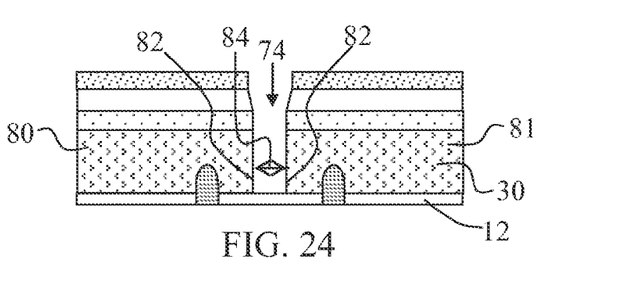

The method continues as shown in FIGS. 21-24 with etching the selected portion 72 of each gate line 30. FIG. 21 is an overhead view of the integrated circuit 10, FIG. 22 is a cross-sectional view taken along line 22-22 in FIG. 21, FIG. 23 is a cross-sectional view taken along line 23-23 in FIG. 21, and FIG. 24 is a cross-sectional view taken along line 24-24 in FIG. 21. The selected portion 72 of each gate line 30 is anisotropically etched to form trenches 74 exposing the underlying semiconductor substrate 12. In the plane of FIG. 23, the selected portions 72 of the gate lines 30 are bound by the sidewall spacers 40, such that the trenches 74 are bound by the sidewall spacers 40. In this manner, the gate etch is self-aligned. Referring to FIG. 24, etching the gate lines 30 is shown to separate two adjacent gate structures 80 and 81. Each gate structure 80 and 81 has an end or tip 82 and the gate structures 80 and 81 are separated by a tip-to-tip distance, indicated by double-headed arrow 84. The tip-to-tip distance 84 is controlled by selectively adjusting the dimension 61 of the open region 60 in the photoresist layer 58 in FIG. 8 and by selectively adjusting the slope of the tapered walls 64 in FIG. 16. In an exemplary embodiment, the tip-to-tip distance 84 is from about 10 nm to about 50 nm, such as about 30 nm.

Figure 25:
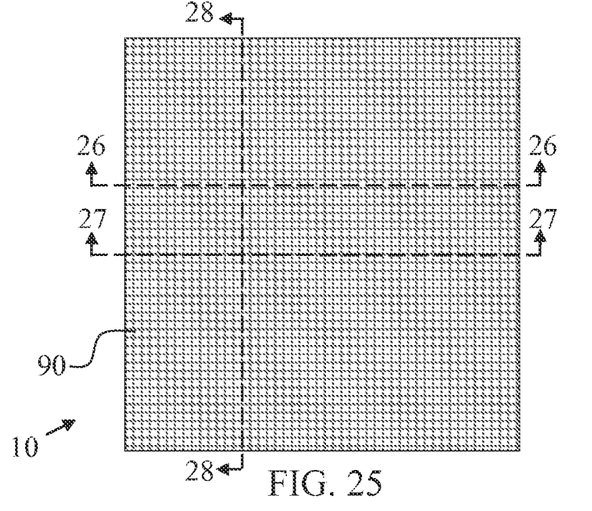
Figure 26:
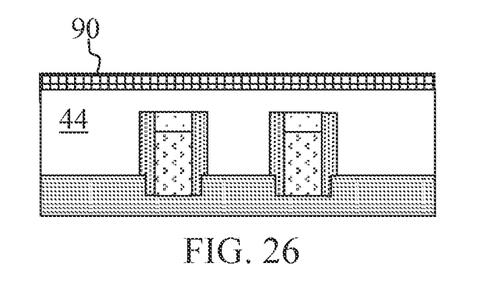
Figure 27:
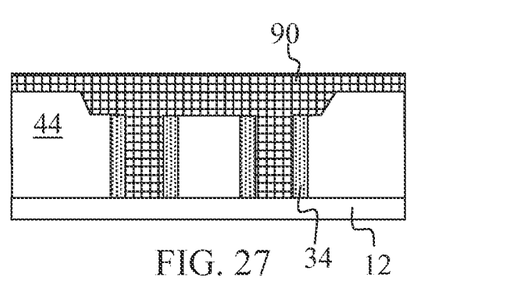
Figure 28:
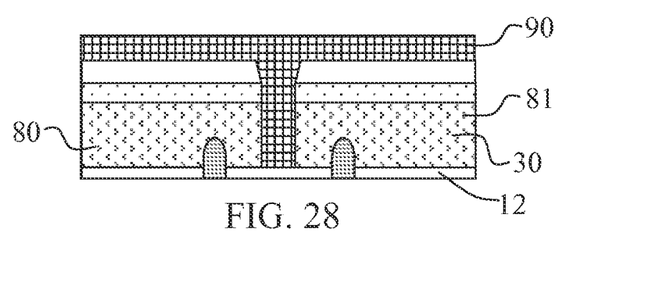
Figure 29:
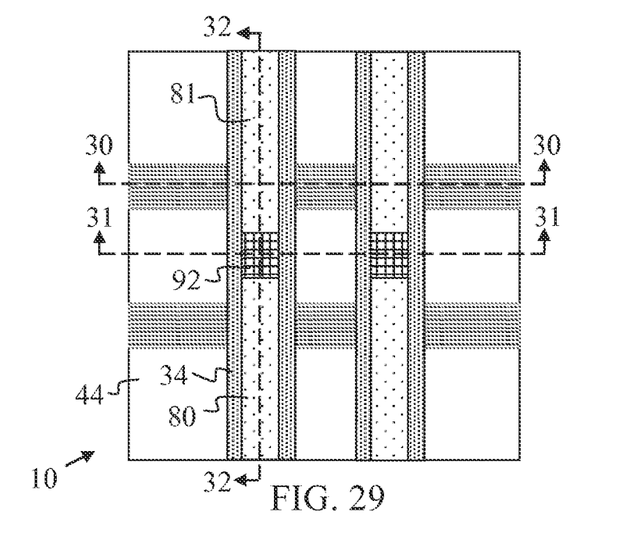
Figure 30:
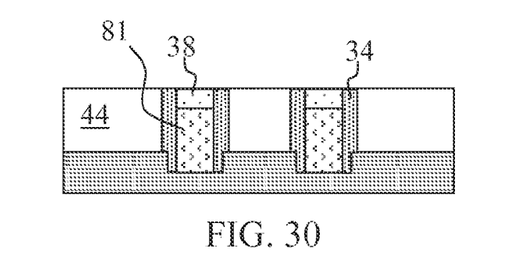
Figure 31:
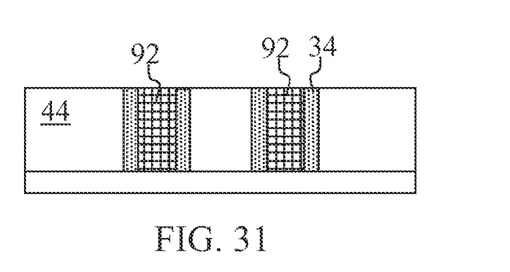
Figure 32:
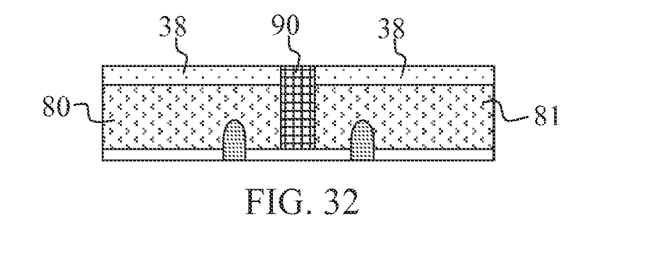

In FIGS. 25-28, the OPL 54 is removed. FIG. 25 is an overhead view of the integrated circuit 10, FIG. 26 is a cross-sectional view taken along line 26-26 in FIG. 25, FIG. 27 is a cross-sectional view taken along line 27-27 in FIG. 25, and FIG. 28 is a cross-sectional view taken along line 28-28 in FIG. 25. After removing the OPL 54, a dielectric material 90 is deposited over the dielectric layer 44, sidewall spacers 40 and semiconductor substrate 12, including filling the trenches between gate structures 80 and 81 formed from each gate line 30. In an exemplary embodiment, the dielectric material 90 is silicon oxide, though other suitable dielectric materials may be used. Then, the dielectric material 90 is planarized, such as by CMP, as shown in FIGS. 29-32. FIG. 29 is an overhead view of the integrated circuit 10, FIG. 30 is a cross-sectional view taken along line 30-30 in FIG. 29, FIG. 31 is a cross-sectional view taken along line 31-31 in FIG. 29, and FIG. 32 is a cross-sectional view taken along line 32-32 in FIG. 29. In the exemplary embodiment, planarization of the dielectric material 90 lands on the cap 38 above each gate structures 80 and 81, as shown in FIGS. 30 and 32. As a result, dielectric blocks 92 are formed from the dielectric material between adjacent gate structures 80 and 81, and have a length equal to the tip-to-tip distance 84.

While the illustrated embodiment forms a single dielectric block 92 between the gate structures 80 and 81 formed from each gate line, typical processing may form thousands of gate structures 80 and 81 separated by thousands of dielectric blocks 92. Similar to each gate structures 80 and 81, each dielectric block 92 is formed between and bound by the parallel sidewall spacers 40. Thus, the integrated circuit 10 includes an alternating gate structures 80 and 81 and dielectric blocks 92 bounded by parallel sidewall spacers 40.

Figure 33:
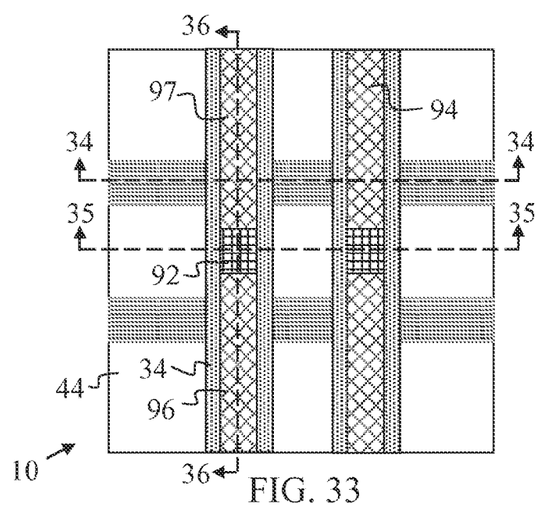
Figure 34:
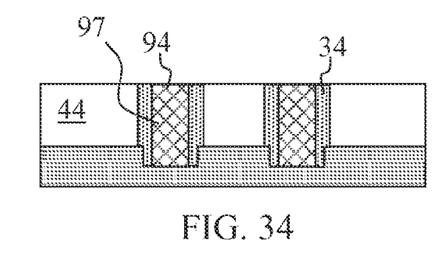
Figure 35:
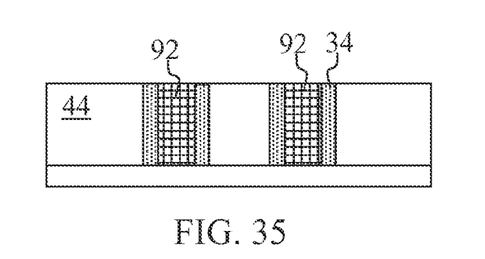
Figure 36:
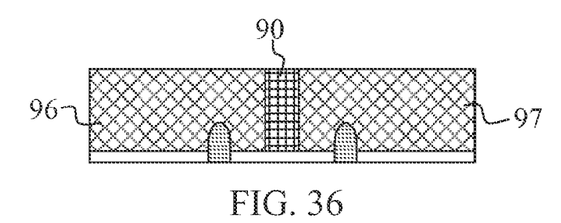

FIGS. 33-36 illustrate a replacement gate process, in which the gate structures 80 and 81 are removed and replaced with replacement gate material 94 to form replacement gate structures 96 and 97. FIG. 33 is an overhead view of the integrated circuit 10, FIG. 34 is a cross-sectional view taken along line 34-34 in FIG. 33, FIG. 35 is a cross-sectional view taken along line 35-35 in FIG. 33, and FIG. 36 is a cross-sectional view taken along line 36-36 in FIG. 33. In an exemplary embodiment, the replacement gate material 94 includes a layer of high-k dielectric layer and a layer of metal gate material. Replacement gate processes are well-known and include the removal of caps 38 and the underlying gate structures 80 and 81, followed by the deposition of the various replacement gate material layers and planarization thereof to form the replacement gate structures 96 and 97. As shown, the replacement gate structures are self-aligned between the dielectric blocks 92 and spacers 40. Specifically, the dielectric blocks 92 and spacers 40 completely bound the replacement gate structures 96 and 97. Further processing may include contact formation, interconnect formation, and other back-end-of-line processing to complete the integrated circuit 10.

Exemplary integrated circuit fabrication methods described herein utilize a first gate etch process to form gate lines from a blanket-deposited gate-forming material, spacer formation around the gate line, and a second gate etch process to form gate structures separated by a tip-to-tip distance. The second gate etch process is self-aligned between the spacers around each gate line. The tip-to-tip distance may be sub-lithographic as it is not limited by the parameters of the first gate etch process.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
    providing a semiconductor substrate with fin structures;
    depositing a gate-forming material over the semiconductor substrate and fin structures;
    performing a first etch process to etch the gate-forming material to form a gate line having a first side and a second side;
    bounding the first side and second side of the gate line with a sidewall material; and
    performing a second etch process to remove a portion of the gate line and form a trench self-aligned with the sidewall material, wherein the trench separates the gate line into adjacent gate structures and defines a tip-to-tip distance between the adjacent gate structures.

2. The method of claim 1 wherein depositing the gate-forming material comprises depositing amorphous silicon over the semiconductor substrate and fin structures.

3. The method of claim 1 wherein the trench is bound between a first portion and an opposite second portion of the sidewall material, wherein the method further comprises filling the trench with a dielectric material, and wherein the dielectric material contacts the first portion and the second portion of the sidewall material.

4. The method of claim 1 wherein:
    performing the first etch process comprises etching the gate-forming material to form parallel gate lines, wherein each gate line has a first side and a second side,
    bounding the first side and second side of the gate line with sidewall material comprises bounding the first side and second side of each gate line with sidewall material; and
    performing the second etch process comprises removing a portion of each gate line and forming trenches self-aligned with the sidewall material, wherein each trench separates each gate line into adjacent gate structures and defines a tip-to-tip distance between the adjacent gate structures formed from each gate line.

5. The method of claim 1 further comprising patterning a gate cut mask over the gate line to define an exposed region of the gate line, wherein performing a second etch process comprises etching the exposed region of the gate line.

6. The method of claim 5 wherein:
    performing the first etch process comprises etching the gate-forming material to form parallel gate lines, wherein each gate line has a first side and a second side,
    bounding the first side and second side of the gate line with sidewall material comprises bounding the first side and second side of each gate line with sidewall material;
    patterning the gate cut mask comprises patterning a gate cut mask over each gate line to define an exposed region of each gate line; and
    performing the second etch process comprises etching the exposed region of each gate line.

7. The method of claim 1 further comprising:
    depositing a dielectric layer over the gate line and the sidewall material;
    patterning a gate cut mask over the dielectric layer; and
    etching the dielectric layer to define an exposed portion of the gate line, wherein performing a second etch process comprises etching the exposed portion of the gate line.

8. The method of claim 7 wherein etching the dielectric layer comprises forming an opening in the dielectric layer bound by tapered walls and defining a selected portion of the gate line, wherein performing a second etch process comprises etching the selected portion of the gate line.

9. The method of claim 8 further comprising controlling the slope of the tapered walls to adjust the area of the selected portion of the gate line.

10. A method for fabricating an integrated circuit, the method comprising:
providing a semiconductor substrate;
forming a sacrificial gate line having a first side and a second side over the semiconductor substrate;
bounding the first side of the sacrificial gate line with a first sidewall and bounding the second side of the sacrificial gate line with a second sidewall spacer;
etching a region of the sacrificial gate line to form a trench self-aligned with and bounded by the first and second sidewall spacers to separate adjacent sacrificial gate structures and to define a tip-to-tip distance between the adjacent sacrificial gate structures; and
replacing the sacrificial gate structures with replacement gate structures.

11. The method of claim 10 wherein:
forming a sacrificial gate line comprises forming parallel sacrificial gate lines, wherein each sacrificial gate line has a first side and a second side,
bounding the first side of the sacrificial gate line with a first sidewall and bounding the second side of the sacrificial gate line with a second sidewall spacer comprises bounding each side of each sacrificial gate line with sidewall spacers; and
etching a region of the sacrificial gate line comprises etching a region of each sacrificial gate line to form a respective trench self-aligned with and bounded by respective first and second sidewall spacers to separate adjacent sacrificial gate structures from each sacrificial gate line and to define a tip-to-tip distance between the adjacent sacrificial gate structures formed from each sacrificial gate line.

12. The method of claim 10 further comprising patterning a gate cut mask over the sacrificial gate line to define an exposed region of the sacrificial gate line, wherein etching a region of the sacrificial gate line to form a trench self-aligned with and bounded by the first and second sidewall spacers to separate adjacent sacrificial gate structures and to define a tip-to-tip distance between the adjacent sacrificial gate structures comprises etching the exposed region of the sacrificial gate line.

13. The method of claim 12 wherein:
forming a sacrificial gate line over the semiconductor substrate comprises forming parallel sacrificial gate lines over the semiconductor substrate, wherein each sacrificial gate line has a first side and a second side,
bounding the first side of the sacrificial gate line with a first sidewall and bounding the second side of the sacrificial gate line with a second sidewall spacer comprises bounding each side of each sacrificial gate line with sidewall spacers;
patterning the gate cut mask comprises patterning the gate cut mask over each sacrificial gate line to define an exposed region of the each sacrificial gate line; and
etching the exposed region of the sacrificial gate line comprises etching the exposed region of each sacrificial gate line to form a respective trench self-aligned with and bounded by respective first and second sidewall spacers to separate adjacent sacrificial gate structures from each sacrificial gate line and to define a tip-to-tip distance between the adjacent sacrificial gate structures formed from each sacrificial gate line.

14. The method of claim 12 further comprising:
depositing a dielectric layer over the sacrificial gate line and sidewall spacers, wherein the gate cut mask is patterned over the dielectric layer; and
etching the dielectric layer to expose a selected portion of the sacrificial gate line, wherein etching the exposed region of the sacrificial gate line comprises etching the selected portion of the sacrificial gate line.

15. The method of claim 14 wherein etching the dielectric layer comprises forming an opening in the dielectric layer bound by tapered walls.

16. The method of claim 15 further comprising controlling the slope of the tapered walls to adjust the area of the selected portion of the sacrificial gate line.

17. The method of claim 14 wherein etching the selected portion of the sacrificial gate line comprises forming the trench, and wherein the method further comprises filling the trench with a dielectric material.

18. The method of claim 10 further comprising filling the trench with a dielectric material, wherein the dielectric material contacts the first sidewall spacer and the second sidewall spacer.

19. A method for fabricating an integrated circuit, the method comprising:
providing a semiconductor substrate with fin structures;
depositing a gate-forming material over the semiconductor substrate and fin structures;
performing a first etch process to etch the gate-forming material to form a gate line having a first side and a second side;
bounding the first side and second side of the gate line with a material;
forming a cap over the gate line;
depositing a dielectric layer over the cap and the material;
planarizing the dielectric layer to form a planar surface;
patterning a gate cut mask over the planar surface of the dielectric layer;
etching the dielectric layer to expose the gate line; and
performing a second etch process to remove a portion of the gate line bounded by the material to separate the gate line into adjacent gate structures and to define a tip-to-tip distance between the adjacent gate structures.

20. The method of claim 19 wherein performing the second etch process comprises forming a trench in the gate line, and wherein the method further comprises:
removing the gate cut mask;
depositing a dielectric material over the dielectric layer and filling the trench; and
planarizing the dielectric material and the dielectric layer to expose the cap.

* * * * *